(12) United States Patent
He et al.

(10) Patent No.: US 8,385,475 B2
(45) Date of Patent: Feb. 26, 2013

(54) CALIBRATION-FREE LOCAL OSCILLATOR SIGNAL GENERATION FOR A HARMONIC-REJECTION MIXER

(75) Inventors: Xin He, Waalre (NL); Johannes H. A. Brekelmans, Nederweert (NL)

(73) Assignee: NXP, B.V., Eindhoven (NL)

( * ) Notice: Subject to any disclaimer, the term of this patent is extended or adjusted under 35 U.S.C. 154(b) by 463 days.

(21) Appl. No.: 12/597,807

(22) PCT Filed: May 8, 2008

(86) PCT No.: PCT/IB2008/051818
§ 371 (c)(1),
(2), (4) Date: Oct. 27, 2009

(87) PCT Pub. No.: WO2008/135954
PCT Pub. Date: Nov. 13, 2008

(65) Prior Publication Data
US 2010/0119022 A1    May 13, 2010

(30) Foreign Application Priority Data

May 8, 2007 (EP) ..................................... 07107724

(51) Int. Cl.
*H03D 1/00* (2006.01)
(52) U.S. Cl. ........................................ 375/339; 375/332
(58) Field of Classification Search .......... 375/323–332, 375/339
See application file for complete search history.

(56) References Cited

U.S. PATENT DOCUMENTS 7,095,801 B1 * 8/2006 Magoon et al. ............... 375/302
7,164,901 B2 * 1/2007 Zheng et al. .................. 455/324
7,301,991 B2 * 11/2007 Okumura et al. ............. 375/148

(Continued)

FOREIGN PATENT DOCUMENTS

DE    10 2005 029273 A    12/2006
EP            1545006 A1     6/2005

(Continued)

OTHER PUBLICATIONS

Brekelmans, H., et al; "Pre-Study Result RF Tuner for TV on Mobile in CMOS90"; Technical Note PR-TN 2005/01139; Feb. 2006.

(Continued)

*Primary Examiner* — Emmanuel Bayard

(57) ABSTRACT

A circuit for producing multiple switching control signals for a harmonic rejection mixer from multiple phases of a digital local oscillator signal is presented, wherein a first waveform combiner circuit is arranged to generate from the multiple phases of the digital local oscillator signal at least one switching control signal by logical combining two from the multiple phases of a digital local oscillator signal, and a second waveform combiner circuit is arranged to generate from the multiple phases of the digital local oscillator signal at least one first switching control signal by logical combining one from the multiple phases of a digital local oscillator signal with a predetermined signal having a static logical value. To compensate for phase errors the schematic topology of the first and the second waveform combiner circuit are arranged to be fully symmetrical to each other in that in the first waveform combiner, the circuit part for providing the function of the second waveform combiner is used as a dummy circuit, and in the second waveform combiner, a circuit part for providing the function of the first waveform combiner is used as a dummy circuit. Accordingly, the sources for providing the multiple phases of the digital local oscillator signal see the same load, and hence required phase shift is guaranteed.

14 Claims, 7 Drawing Sheets

U.S. PATENT DOCUMENTS

| | | | |
|---|---|---|---|
| 7,634,027 B2 * | 12/2009 | Behzad et al. | 375/319 |
| 7,894,778 B2 * | 2/2011 | Li | 455/76 |
| 7,920,642 B1 * | 4/2011 | Esposito | 375/295 |
| 7,978,785 B2 * | 7/2011 | Leifso | 375/302 |
| 2002/0030529 A1 * | 3/2002 | Lee et al. | 327/359 |
| 2002/0197972 A1 * | 12/2002 | Wong et al. | 455/302 |
| 2005/0175130 A1 * | 8/2005 | Yang | 375/350 |
| 2005/0215223 A1 | 9/2005 | Lin et al. | |
| 2005/0233723 A1 | 10/2005 | Gomez et al. | |
| 2005/0239430 A1 | 10/2005 | Shah | |
| 2006/0205370 A1 | 9/2006 | Hayashi et al. | |
| 2006/0246861 A1 * | 11/2006 | Dosanjh et al. | 455/147 |
| 2006/0261845 A1 * | 11/2006 | Kim et al. | 326/30 |
| 2007/0072575 A1 * | 3/2007 | Sowlati et al. | 455/318 |
| 2011/0103526 A1 * | 5/2011 | Li et al. | 375/340 |
| 2012/0081822 A1 * | 4/2012 | Woo et al. | 361/56 |

FOREIGN PATENT DOCUMENTS

| | | |
|---|---|---|
| WO | 03/065585 A1 | 8/2003 |
| WO | 2007/004181 A2 | 1/2007 |

OTHER PUBLICATIONS

International Search Report for Application No. PCT/IB2008/051818 (Jun. 16, 2009).

* cited by examiner

CALIBRATION-FREE LOCAL OSCILLATOR SIGNAL GENERATION FOR A HARMONIC-REJECTION MIXER

FIELD OF THE INVENTION

The present invention relates to a method and a circuit implementing the method for producing multiple switching control signals for a harmonic rejection mixer from multiple phases of a digital local oscillator signal.

In particular, the present invention concerns the timing of the multiple switching control signals in terms of a phase shift between to be calibration-free.

BACKGROUND OF THE INVENTION

In digital television (DTV) receivers there is a demand to reject interferences at the third order and the fifth order of the desired DTV frequencies, which are introduced, for instance, by wireless applications in accordance to the standards of communication networks of the second generation (2G) and/or third generation (3G). One setback is caused by the fact that these third order harmonics and fifth order harmonics of the frequencies in question cannot be completely filtered out by means of RF filters. Therefore, a harmonic-rejection mixer is necessary for coexistence.

It was figured out that one critical specification of a harmonic rejection mixer is located in the relative time shift in the components constituting the switching control signal waveform, as for instance, described by H. Brekelmans and L. Tripodi in "Pre-study result RF tuner for TV on Mobile in CMOS90", Technical Note PR-TN 2005/01139, February 2006. In FIG. 4A, the time shift Td, i.e. the relative time shift between a rooftop and a main switching waveform which combine to one switching control signal, is illustrated. Further, as depicted in FIG. 4B, the time shift Td must substantially not exceed 4 psec to maintain 40 dB of rejection. Accordingly, with respect to a period of T=1.25 nsec at 800 MHz, only error of 0.32% is acceptable.

Therefore, it is an object of the invention to provide an improved method and apparatus for generation of a LO frequency in a harmonic-rejection receiver.

It is yet another object of the invention to provide an improved method and apparatus for generation of a LO frequency, by which systematic phase errors can be avoided, thus additional calibration means may be eliminated. The invention is defined by the independent claims. Dependent claims describe advantageous embodiments.

SUMMARY OF THE INVENTION

In a first aspect of the present invention a circuit for producing multiple switching control signals for a harmonic rejection mixer from multiple phases of a digital local oscillator signal is presented that comprises: a first waveform combiner circuit arranged to generate from the multiple phases of the digital local oscillator signal at least one switching control signal by logical combining two from the multiple phases of a digital local oscillator signal; and a second waveform combiner circuit arranged to generate from the multiple phases of the digital local oscillator signal at least one first switching control signal by logical combining one from the multiple phases of a digital local oscillator signal with a predetermined signal having a static logical value; wherein the schematic topology of the first and the second waveform combiner circuit are fully symmetrical to each other; wherein in the first waveform combiner the circuit part for providing the function of the second waveform combiner is used as a dummy circuit; and wherein in the second waveform combiner the circuit part for providing the function of the first waveform combiner is used as a dummy circuit.

In a further aspect of the present invention a method for producing multiple switching control signals for a harmonic rejection mixer from multiple phases of a digital local oscillator signal is presented, wherein the method comprises: a first generating step for generating from a first group of the multiple phases of the digital local oscillator signal at least one first switching control signal by logical combining two from the multiple phases of a digital local oscillator signal; and a second generating step for generating from a second group of the multiple phases of the digital local oscillator signal at least one second switching control signal by logical combining one from the multiple phases of a digital local oscillator signal with a predetermined signal having a static logical value; and in the first generating step, as a dummy load also generating from the first group of the multiple phases of the digital local oscillator signal at least one dummy switching control signal by logical combining one from the multiple phases of a digital local oscillator signal with a predetermined signal having a static logical value; and in the second generating step, as a dummy load also generating from the second group of the multiple phases of the digital local oscillator signal at least one dummy switching control signal by logical combining two from the multiple phases of a digital local oscillator signal.

Accordingly, the concept of the invention provides for a calibration-free generation of the switching control signals required in a harmonic rejection receiver. By the idea of using dummy circuitry, a fully symmetrical waveform combiner circuit topology is provided such that the required accuracy in respect of an allowable error in phase shift can be achieved. Moreover, extra 45° phase correction loop(s) as used in conventional topologies are not required.

In one embodiment the first waveform combiner circuit is supplied with four phases of the digital local oscillator signal as input signals, each having a phase shift of 90° with respect to two other phases of these four phases, and the second waveform combiner circuit is supplied with four phases of the digital local oscillator signal as input signals, each having a phase shift of 45° with respect to two other phases of these four phases.

In one embodiment the multiple phases of the digital local oscillator signal are generated form a digital local oscillator signal by two stages of two respective cascaded divide-by-2 circuits.

In a further development the multiple phases of the digital local oscillator signal are generated by a divide-by-4 circuit from a predetermined source digital local oscillator signal having fourth times of the digital local oscillator signal. The divide-by-4 circuit can be comprised of four latches connected in a ring configuration with an inverted polarity at the input of a first of the four latches, wherein the first latch and a third latch of the ring configuration being triggered by the rising edge of the digital local oscillator signal, and a second latch and a fourth latch of the ring configuration being triggered by the falling edge of the digital local oscillator signal. By means of the one-stage divide-by-4 circuit also further phase uncertainty problems can be avoided which may exists in two cascaded stages of divide-by-2 circuits.

In one specific embodiment, the multiple phases of the digital local oscillator signal comprises eight respectively phase shifted phases of the digital local oscillator, which are generated from a input clock operated at 4 times of the digital local oscillator signal frequency; wherein the first waveform combiner circuit is arranged to generate from four of the multiple phases of the digital local oscillator signal four first switching control signals having a 25% duty-cycle; and wherein the second waveform combiner circuit is arranged to generate from four of the multiple phases of the digital local oscillator signal four second switching control signals having a 50% duty-cycle.

An possible application of the method and circuit disclosed above is a harmonic rejection mixer for mixing a input signal comprised of a in-phase and a quadrature input signal with a digital local oscillator signal, wherein the harmonic rejection mixer comprises two switching cores, wherein a first switching core is switched by the first switching control signals and a second switching core is switched by the second switching control signals, wherein pulse centers of the second switching control signals coincide with pulse centers of the first switching control signals; and wherein the first and second switching control signals are generated by means of a circuit for producing multiple switching control signals from multiple phases of a digital local oscillator signal according to one embodiment disclosed above.

BRIEF DESCRIPTION OF THE DRAWINGS

These and other aspects of the invention will be apparent from and elucidated with reference to the embodiment(s) described hereinafter. In the following drawings

Figure 1:
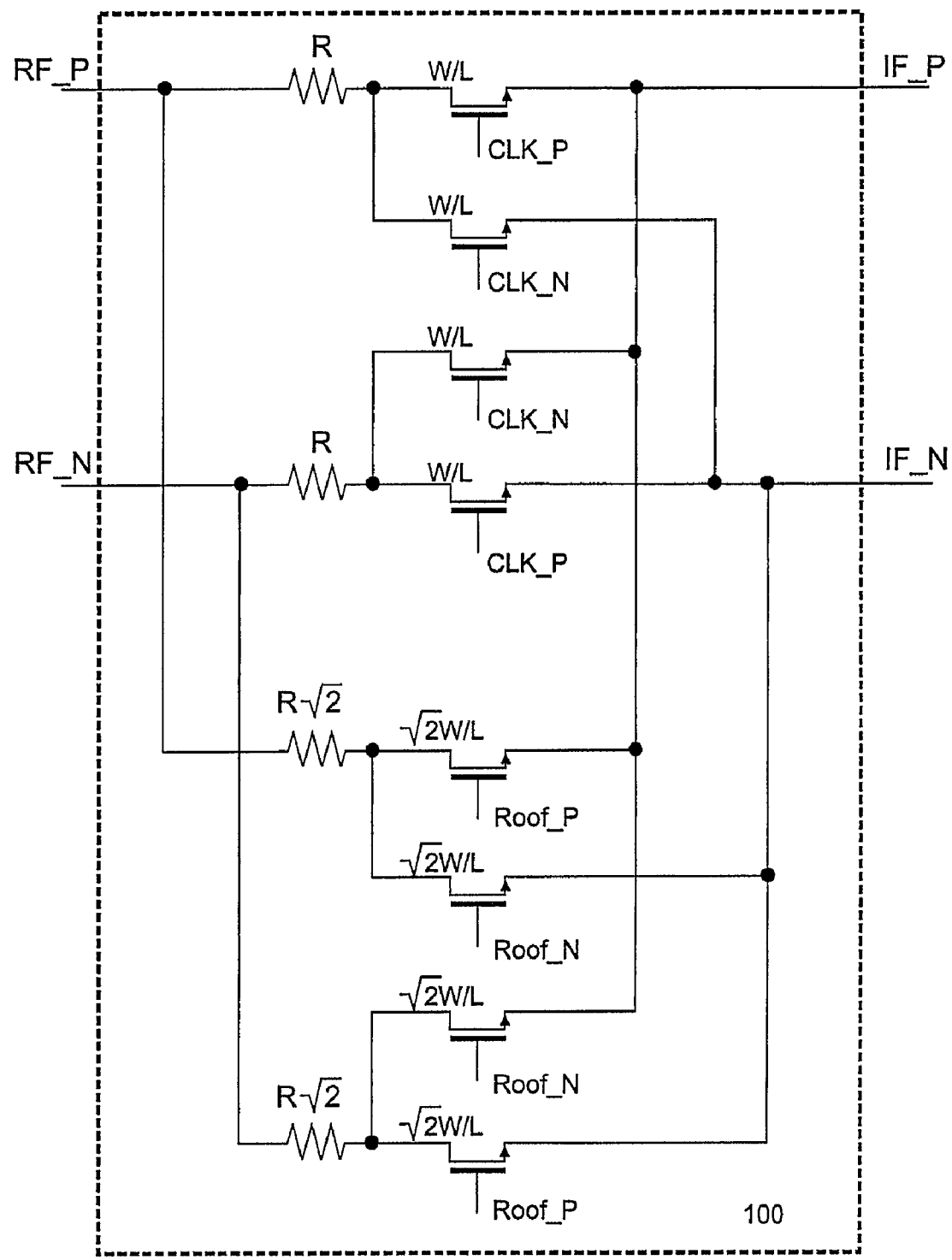
FIG. 1 shows an example for a harmonic-rejection (HR) mixer comprising two NMOS switching cores.

It should be noted that the Figures are schematically drawn and not necessarily true to scale. Identical reference numerals in different Figures, if any, refer to corresponding elements. It will be clear for those skilled in the art that alternative but equivalent embodiments of the invention are possible without deviating from the true inventive concept, whilst the scope of the invention is limited by the claims only.

DETAILED DESCRIPTION OF EMBODIMENTS

In FIG. 1, an simplified example for an harmonic-rejection (HR) mixer, which is configured to rejected the 3rd order and 5th order harmonics of a local oscillator (LO) frequency, is shown, which provides for low noise and high third-order intercept point (IP3) performance, as required, for example, in TV on Mobile (TVoM) applications.

Figure 3:
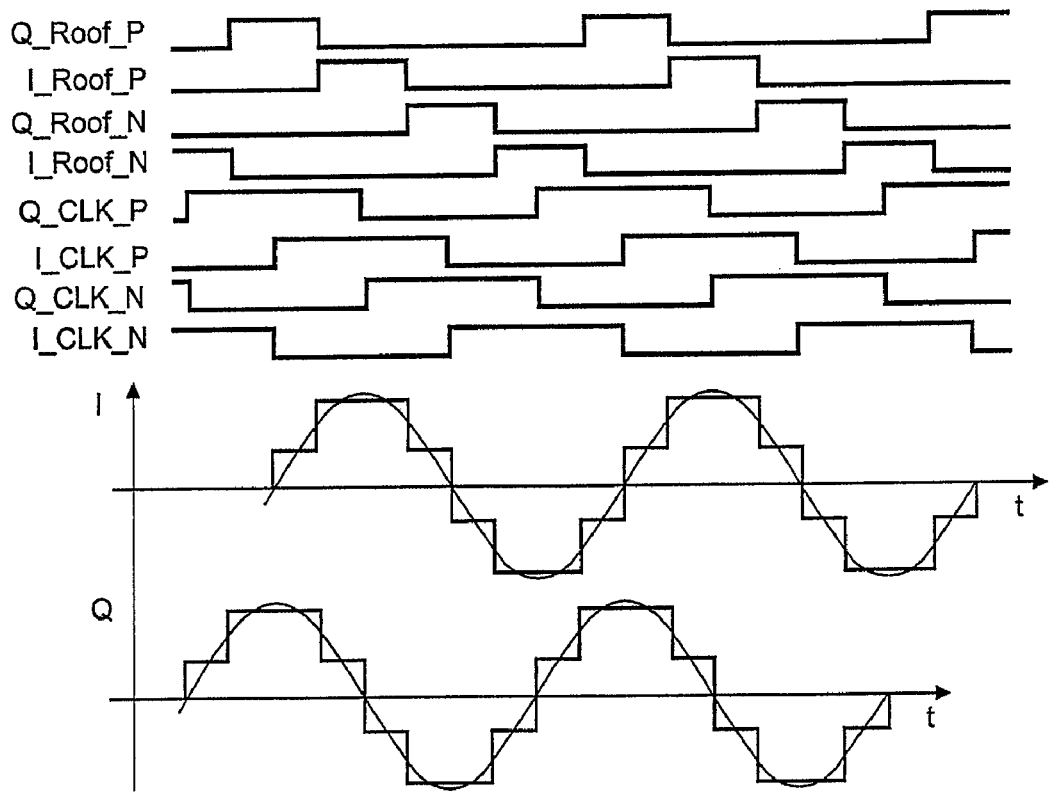
FIG. 3 illustrates the required quadrature switching control signals for an IQ-HR mixer and the equivalent quadrature LO signals in the respective IQ-HR-mixer.

As shown in FIG. 1, this mixer 100, basically, consists of two NMOS switching cores 110, 120, where the switching core 110 (on the top of FIG. 1) is controlled by a 50% duty-cycle LO frequency, which is exactly same as in a conventional passive mixer, and the other switching core 120 (on the bottom of FIG. 1) is controlled by 25% duty-cycle LO, whose pulse center coincides with the pulse center of the 50% duty cycle LO frequency. Waveform Roof_P is located (just like a "roof") exactly in the center of waveform CLK_P. It is noted, that for use with communication signals comprising an In-phase (I) and a Quadrature (Q) component or channel, two similar constructed mixers 100 are needed, the required switching control signals therefor are shown in FIG. 3.

It goes without saying that the switching cores of FIG. 1 may be modified in various ways. For example, NPN transistors can be directly substituted for the NMOS field-effect transistors shown in FIG. 1. Further, it may be desirable to use gallium arsenide field-effect transistors in order to permit operation at higher RF transmission frequencies, but alternatively, silicon field-effect transistors may be used in order to integrate a wireless receiver with CMOS digital circuits using a standard CMOS process.

For instance, by setting the transistor width in the bottom core 120 to $\sqrt{2}$ times the transistor width in the top core 110, and the resistance in the bottom core 120 to $1/\sqrt{2}$ times the resistance in the top core 110, the current yielded in the bottom core 120 is $\sqrt{2}$ times the current yielded in the top core 110 when they are both switched on.

Figure 2:
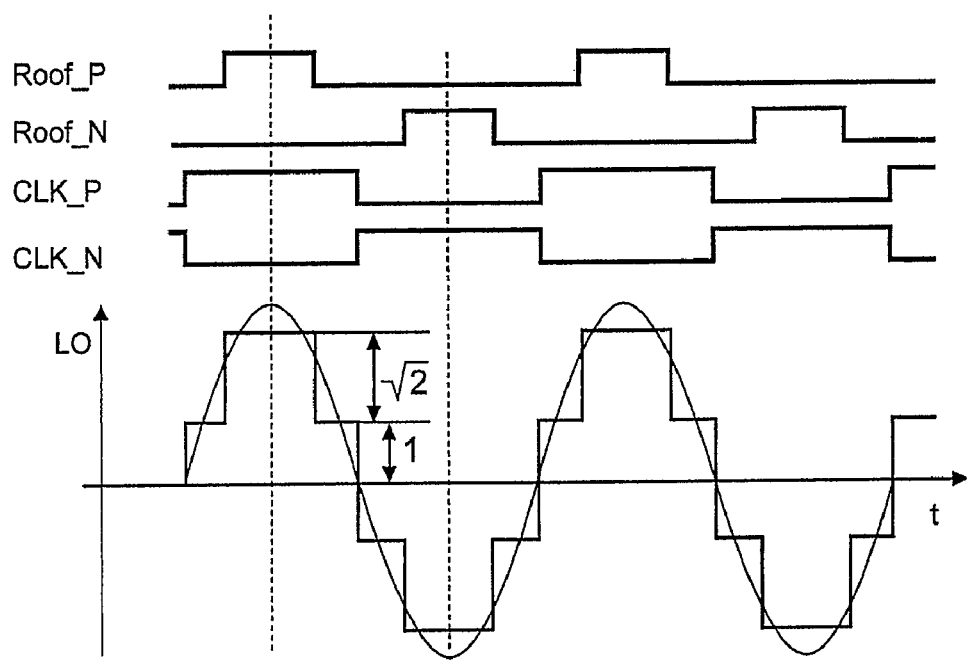
FIG. 2 illustrates switching control signals for the HR mixer of FIG. 1 and the equivalent local oscillator (LO) signal in the harmonic-rejection mixer.

By means of current summing, the resulting output waveform is as shown in FIG. 2, provided that the RF inputs RF_P and RF_N are DC. The equivalent LO envelope emulates a sine wave and thus rejects the RF interference with the frequency at the third order and the fifth order harmonic of the used LO frequency, while translating (i.e. mixing down) the desired RF signal to the baseband.

As mentioned above, in order to demodulate both the I (In phase) and Q (Quadrature) channel, equivalent quadrature switching control signals, i.e. LO clocks, are to be generated, as illustrated in FIG. 3. In practice, the accuracy in time and amplitude of the individual switching control signal waveforms will determine the ratio of the desired harmonic rejection (HR).

It was figured out that the most critical specification is relative time shift between the rooftop and the main switching waveform, as for instance, described by H. Brekelmans and L. Tripodi in "Pre-study result RF tuner for TV on Mobile in CMOS90", Technical Note PR-TN 2005/01139, February 2006.

Figure 4A:
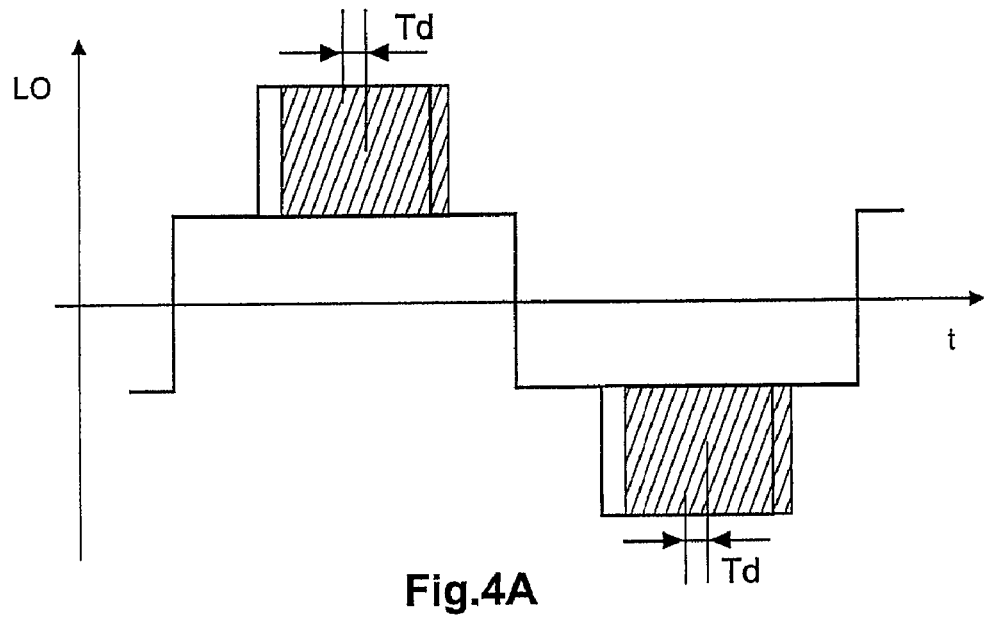
FIG. 4A illustrates a time shift Td of the rooftop LO waveform in the harmonic rejection mixer of FIG. 1.
Figure 4B:
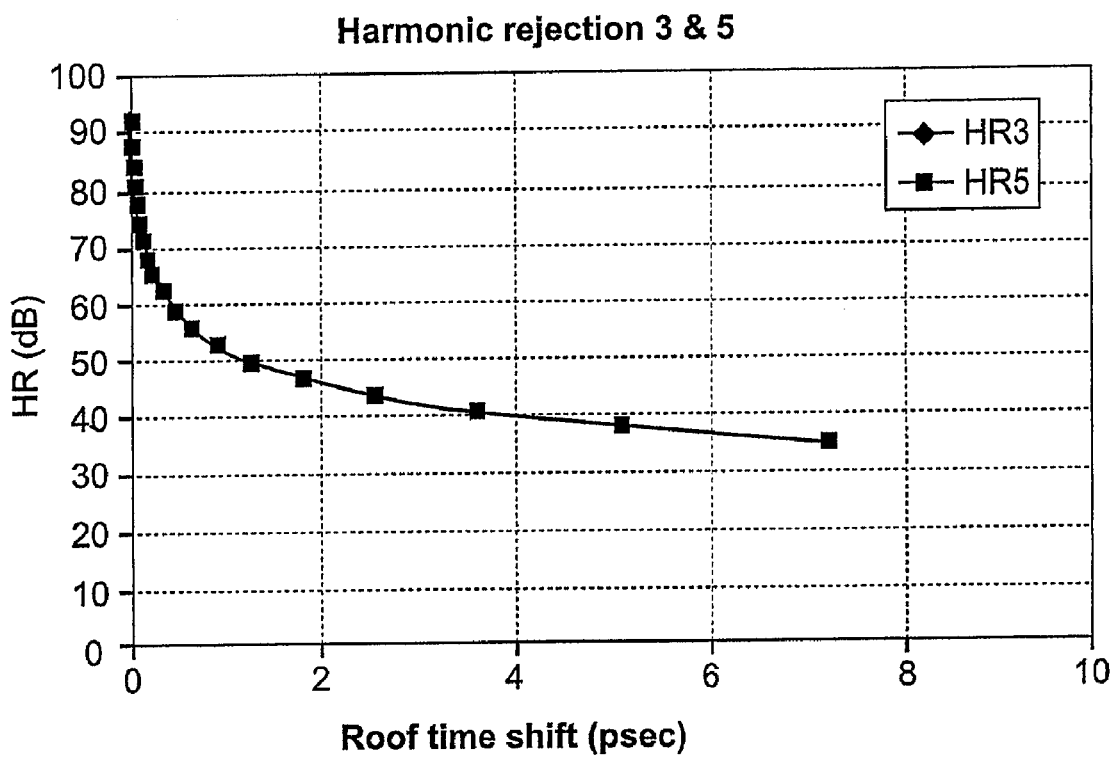
FIG. 4B illustrates rejection of the $5^{th}$ order harmonic as a function of the shift Td of the rooftop switching control signals in FIG. 4A.

In FIG. 4A, the time shift Td, i.e. the relative time shift between the rooftop and the main switching waveform, is illustrated. As depicted in FIG. 4B, the time shift Td must substantially not exceed 4 psec to maintain 40 dB of rejection. Accordingly, with respect to a period of T=1.25 nsec at 800 MHz, only error of 0.32% is acceptable.

Figure 5:
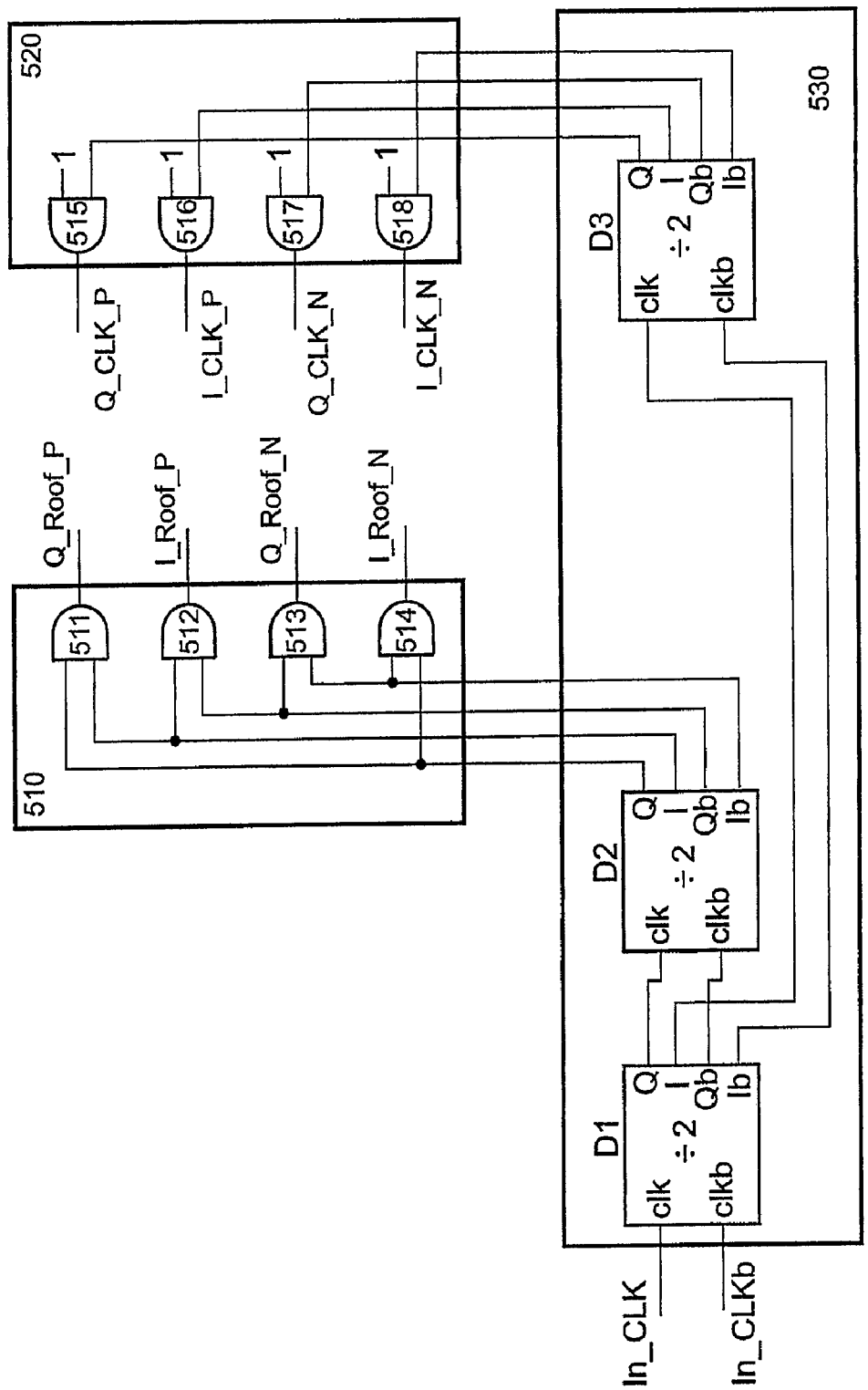
FIG. 5 shows a first approach for the harmonic-rejection LO generation.
Figure 6:
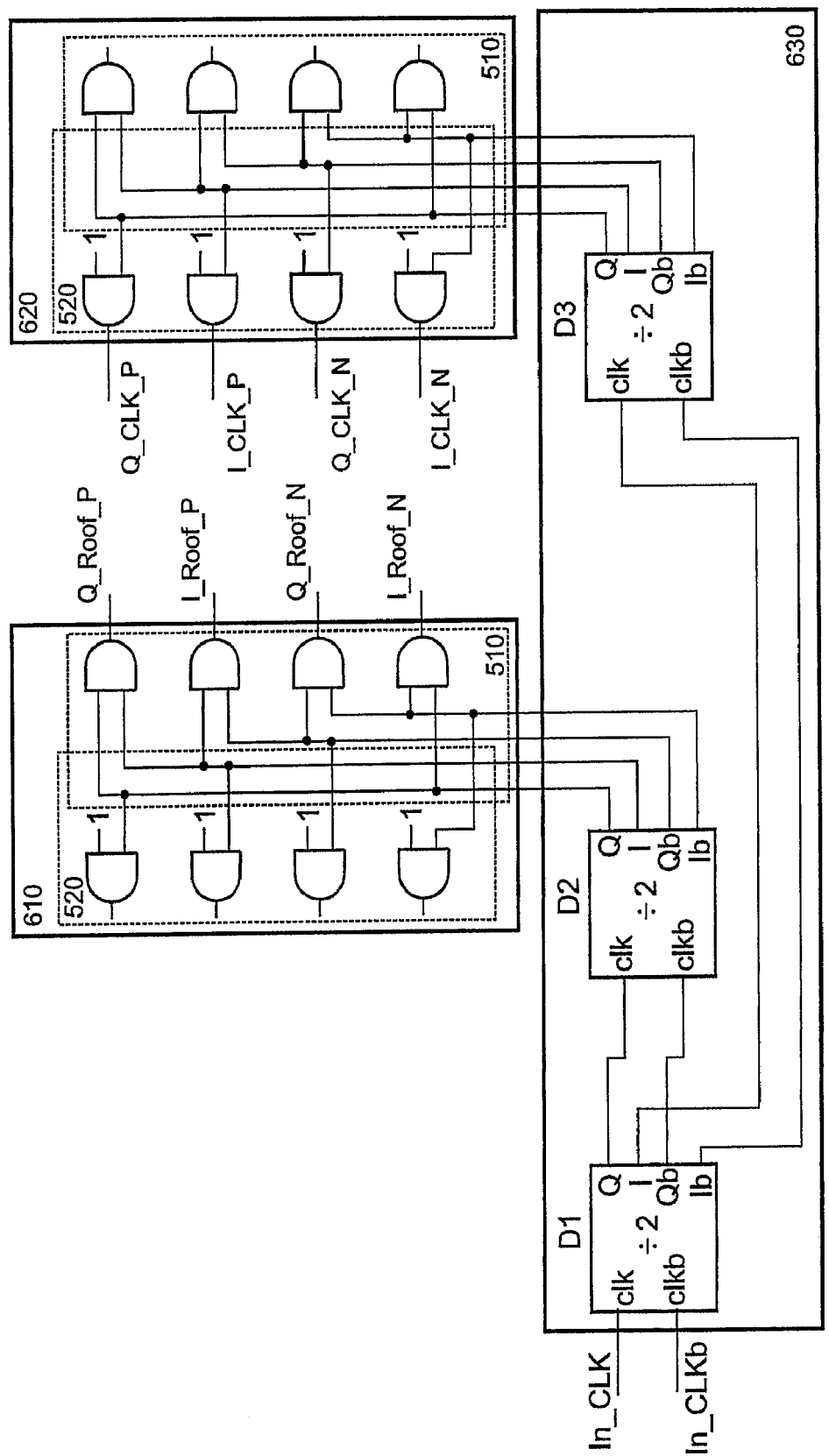
FIG. 6 shows an embodiment of a fully symmetric harmonic rejection LO generation.

As described above, for use in an harmonic rejection receiver, a calibration free generator for generating the required multiple phases of a local oscillator frequency for generating the switching control signals according to the invention is presented, in which a fully symmetrical waveform generation topology and dummy circuitry will be proposed. In one embodiment the local oscillator (LO) generator circuit comprises eight phases of oscillator waves generated by differential flip-flops (D-FF) as shown in FIG. 5. In FIG. 6, the same generator circuit is enhanced by introduction of dummy circuits for generating 50% and 25%, respectively, duty-cycle waveforms. As a further development, an alternative approach will be shown in connection with FIG. 7A, where the frequency divider comprises a divide-by-4 circuit.

Now with respect to FIG. 5, in order to generate the eight phases of a digital local oscillator signal (or LO waveforms), in a first approach two cascaded stages of divide-by-2 circuits are used. Accordingly, a differential input clock In_CLK operates at 4 times of the desired digital local oscillator frequency (LO frequency) to be generated. A first divide-by-2 (or divider, for short) D1 provides four quadrature outputs with 90° phase shift, while the frequency is half of the input clock In_CLK. Following dividers D2 and D3 further halve (divide by 2) the clock to the desired LO frequency, meanwhile obtaining 45° phase shift at the output.

The required switching control signals with 25% duty-cycle generated in waveform combiner 510 by respective logical "AND" combinations, e.g. by use of a AND circuit or AND gate, of respectively two outputs from the divider D2. It goes without saying that the logical "AND" combination is used in this example for purpose of illustration, i.e. it is not essential for the principle of the here disclosed solution. For example, the logical AND combination by AND gate 511 of the outputs Q and I of the divider D2 generates the required Q_Roof_P, which is shown in the top of FIG. 3.

The corresponding 50% duty cycle switching control signals are generated in waveform combiner 520 by a respective logical "AND" combination of one of the D3 outputs with "1" (or logical High-level). Due to the extra "AND" operation, the 50% duty-cycle LO presents roughly the same delay as the 25% duty-cycle cycle switching control signals do. For instance, by logical AND combination of the "1" and the output Ib (where "b" indicates that Ib corresponds to I negated) of the divider D3 by means of AND gate 518 the required I_CLK_N, which is shown in the bottom of FIG. 3 is generated.

Accordingly, by careful phase alignment of all the outputs of the AND circuits 511 to 518, the desired waveforms for the cycle switching control signals to be used to control the switching cores of a harmonic-rejection mixer can be achieved.

However, the center of the 25% duty-cycle LO is likely not to exactly coincide with the center of the main switching waveform in the approach above. It has been found that this is due to the fact that the output loads of the dividers D2 and D3 are different. In the divider D2 each output feeds two AND gates, whilst in divider D3 each output only feeds one AND gate. Due to different capacitance load the 45° phase shift in dividers D2 and D3 output can hardly be guaranteed. To compensate the phase error, a complex eight-phase correction circuitry would be needed.

Now turning to FIG. 6, which shows the simplified schematic diagram of one embodiment of the improved cycle switching control signal generation with full symmetry according to the invention.

In contrast to the initial approach, shown in FIG. 5, a dummy 50% duty-cycle switching control signal waveform generation, i.e. a waveform combiner 520, is added at the output of divider D2. Further, also a dummy 25% duty-cycle switching control signals waveform generation, i.e. a waveform combiner 510, is added at the output of divider D3, as well. Accordingly, the 50% and 25% duty-cycle waveform generation circuits comprise the same waveform combiner 610 and 620 at the output of D2 and D3. Hence, the two dividers D2 and D3 see the same load, and as a result the desired phase shift can be guaranteed, provided that the duty-cycle of the input clock is 50%.

In the approach discussed above, it has been assumed that the phase of output Q at D2 leads the phase of output Q at divider D3 by 45°. In this respect, it has been found that depending from the circuit implementation it is possible that the phase of output Q at divider D2 lags behind the phase of output Q at divider D3 by 135°. Accordingly, instead of current summing at the output of the HR mixer, the circuit operates as current subtraction, and thus the HR mixer turns into a harmonic mixer. To avoid the above discussed phase uncertainty problem, additional preset component can be added in the divide-by-2 D2 and D3. However, such additional circuitry components may lower the operating frequency and also degrade phase noise.

Figure 7A:
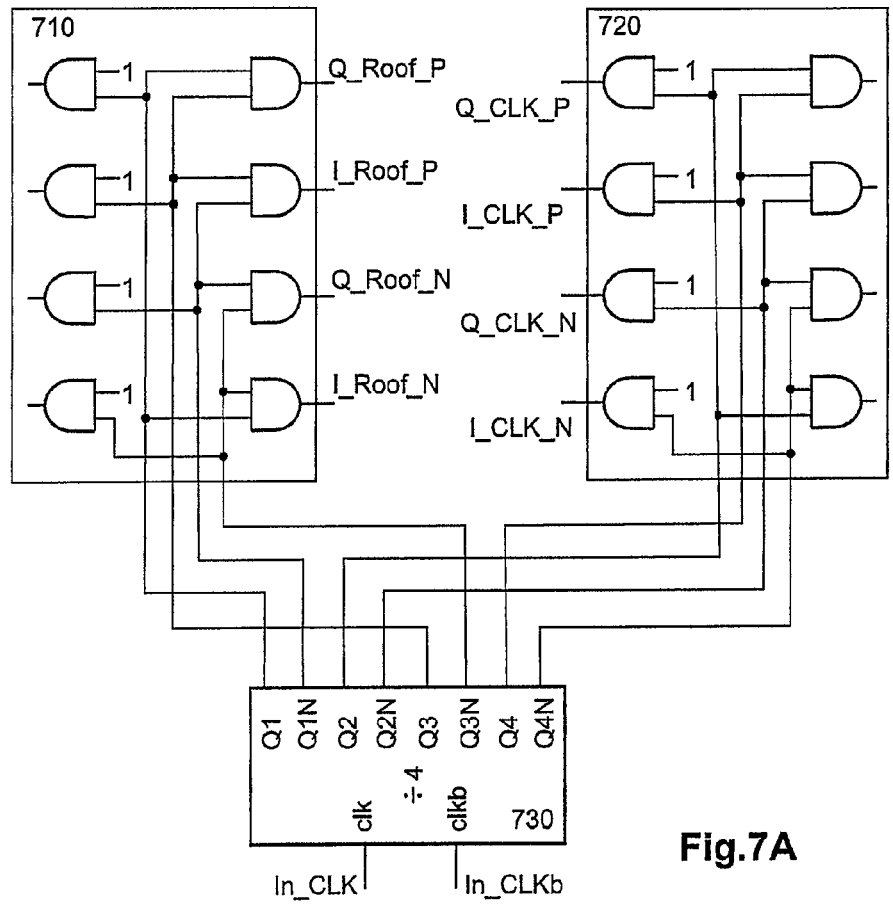
FIG. 7A illustrates a further development of the embodiment shown in FIG. 6.
Figure 7B:
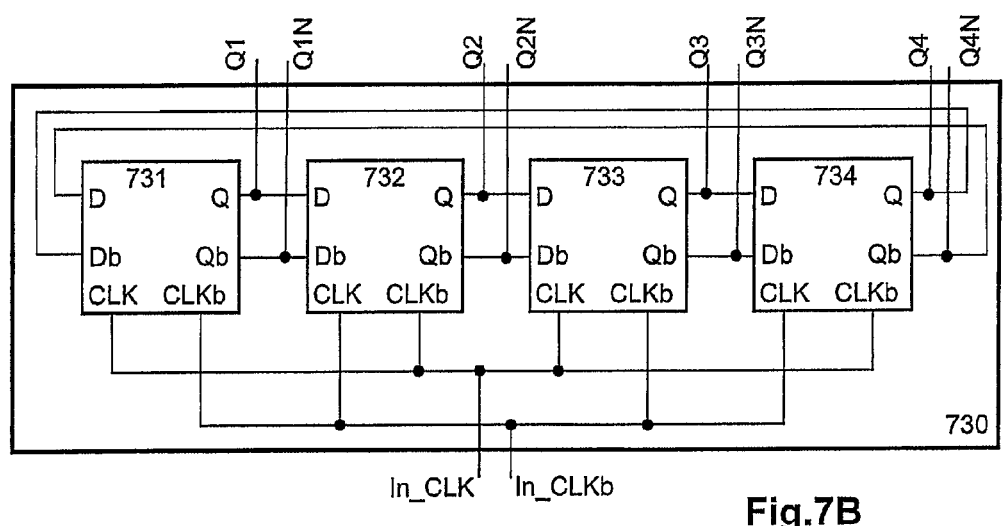
FIG. 7B is an example schematic for the one-stage divide-by-4 as used in the embodiment of FIG. 7A.

In a further development, shown in FIG. 7A, use of a one-stage divide-by-4 circuit is proposed, which replaces the two-cascaded stages 530 (FIG. 5), 630 (FIG. 6) of divide-by-2 circuits D1, D2, and D3 as shown in FIGS. 5 and 6. As illustrated in FIG. 7B, the new divider 730 is comprised of four latches 731, 732, 733, and 734, which are connected as a ring with inverted polarity at the input of the first latch 731.

In addition, the first latch 731 and the third latch 733 are triggered by the rising edge of the input clock In_CLK, while the second latch 732 and the fourth latch 734 are triggered by the falling edge of the input clock by use of the inverse input clock signal In_CLKb. Hence, the phase shift between phase Q1 of the digital local oscillator signal and phase Q2, phase Q2 and phase Q3, as well as phase Q3 and phase Q4 is determined to 45 degree, as required.

Figure 8:
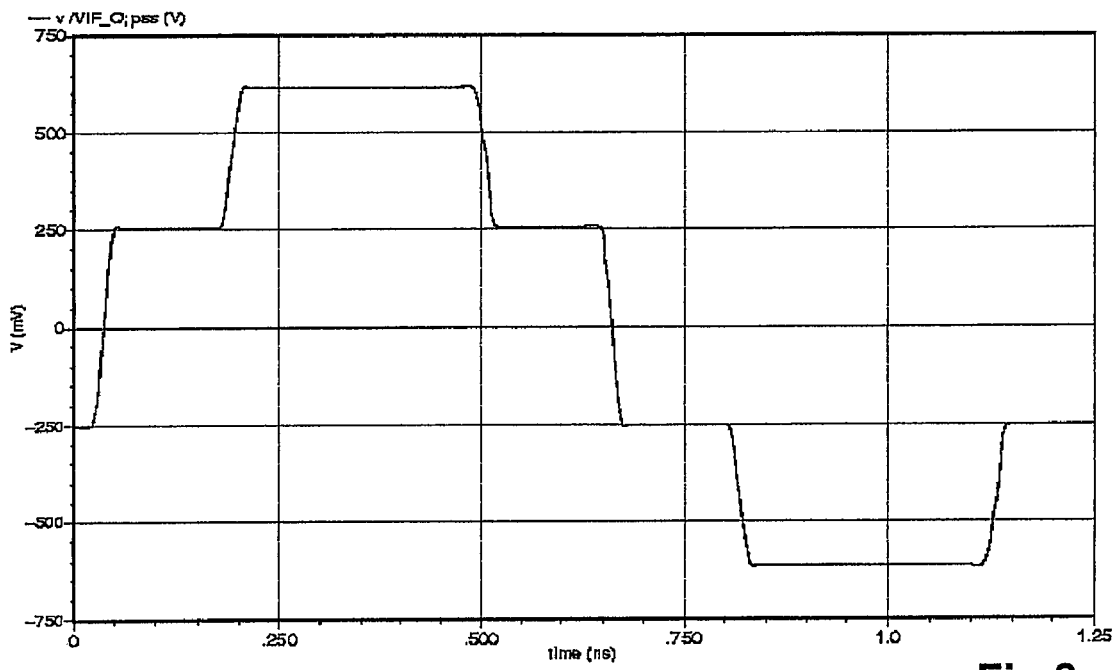
FIG. 8 depicts an example for an equivalent LO waveform obtained at the IF output of the HR mixer according to the invention.
Figure 9A:
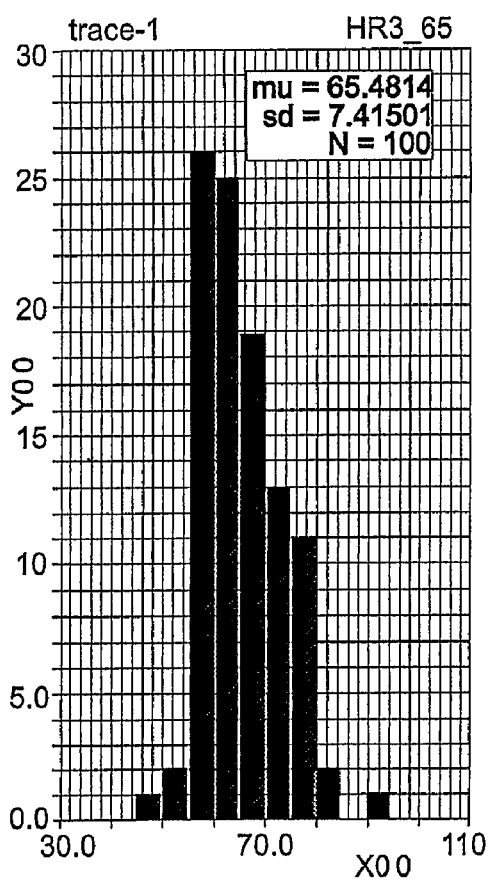
FIGS. 9A and 9B depict Monte-Carlo-simulation results of harmonic-rejection ratio with the method according to the invention.
Figure 9B:
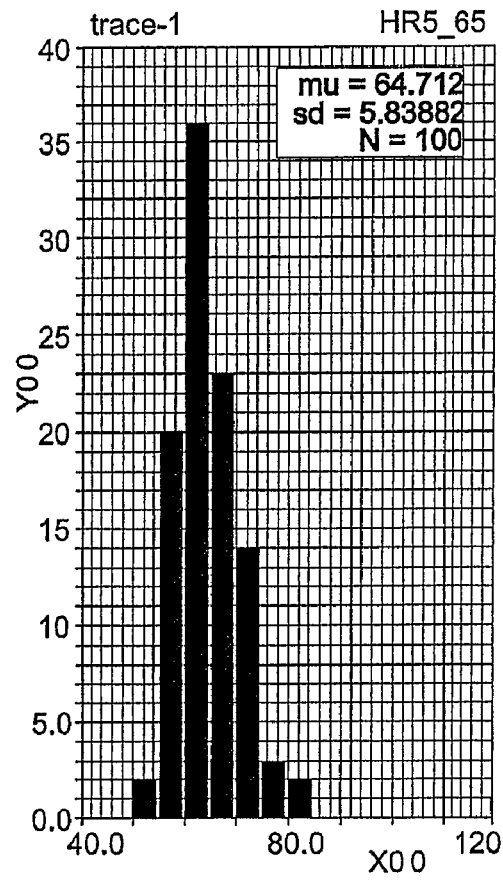

By setting the RF input of the herein proposed harmonic rejection (HR) mixer to be a DC level, the equivalent LO waveform can be obtained at the IF output of the HR mixer, as depicted in FIG. 8. Accordingly, the third order and fifth order HR ratio can be computed from the spectrum of the equivalent LO waveform, i.e., the power of fundamental frequency subtracts the power of the third order or the fifth order of the harmonic. This is illustrated in FIGS. 9A and 9B, which present the schematic-level Monte-Carlo (MC) simulation results with 100 runs. The testbench includes the input LO buffer, the core of HR LO generation, and the HR mixer. The mean of the third order and the fifth order HR ratio is both above 60 dB, providing enough margin in real implementation.

Finally, it should be noted that the circuit arrangement proposed here in FIGS. 6, 7A and 7B can be applied to switching control signal generation for a respective harmonic-rejection (HR) mixer in TVoM applications. Alternatively, the switching control signal generation for an odd harmonic mixer may use the same solution to eliminate calibration loop.

In summary, a circuit for producing multiple switching control signals for a harmonic rejection mixer from multiple phases of a digital local oscillator signal has been presented, wherein a first waveform combiner circuit is arranged to generate from the multiple phases of the digital local oscillator signal at least one switching control signal by logical combining two from the multiple phases of a digital local oscillator signal, and a second waveform combiner circuit is arranged to generate from the multiple phases of the digital local oscillator signal at least one first switching control signal by logical combining one from the multiple phases of a digital local oscillator signal with a predetermined signal having a static logical value. To compensate for phase errors the schematic topology of the first and the second waveform combiner circuit are arranged to be fully symmetrical to each other in that in the first waveform combiner, the circuit part for providing the function of the second waveform combiner is used as a dummy circuit, and in the second waveform combiner, a circuit part for providing the function of the first waveform combiner is used as a dummy circuit. Accordingly, the sources for providing the multiple phases of the digital local oscillator signal see the same load, and hence required phase shift is guaranteed.

In the claims, the word "comprising" does not exclude other elements or steps, and the indefinite article "a" or "an" does not exclude a plurality. A single means or other unit may fulfill the functions of several items recited in the claims. The mere fact that certain measures are recited in mutually different dependent claims does not indicate that a combination of these measured cannot be used to advantage.

A computer program may be stored/distributed on a suitable medium, such as an optical storage medium or a solid-state medium supplied together with or as part of other hardware, but may also be distributed in other forms, such as via the Internet or other wired or wireless telecommunication systems.

Any reference signs in the claims should not be construed as limiting the scope.

The invention claimed is:

1. A circuit for producing multiple switching control signals for a harmonic rejection mixer from multiple phases of a digital local oscillator signal, wherein the circuit comprises:
   a first waveform combiner having a waveform logical combination circuit arranged to generate from the multiple phases of the digital local oscillator signal at least one switching control signal by logical combining two from the multiple phases of the digital local oscillator signal, the first waveform combiner including an output to output the at least one switching control signal to the harmonic rejection mixer; and
   a second waveform combiner having a waveform logical combination circuit arranged to generate from the multiple phases of the digital local oscillator signal at least one first switching control signal by logical combining one from the multiple phases of the digital local oscillator signal with a predetermined signal having a static logical value, the second waveform combiner including an output to output the at least one switching control signal to the harmonic rejection mixer;
   wherein a schematic topology of the first and the second waveform combiners are fully symmetrical to each other;
   wherein the first waveform combiner includes the logical combination circuit of the first waveform combiner and a copy of the logical combination circuit from the second waveform combiner, the copy of the logical combination circuit being configured as a dummy combiner circuit to logically combine one from the multiple phases of the digital local oscillator signal with a static logical value; and
   wherein the second waveform combiner includes the logical combination circuit of the second waveform combiner and a copy of the logical combination circuit from the first waveform combiner, the copy of the logical combination circuit being configured as a dummy combiner circuit to logically combine two from the multiple phases of the digital local oscillator signal.

2. The circuit according to claim 1, wherein the first waveform combiner has as input four phases of the digital local oscillator signal, each having a phase shift of 90° with respect to two other phases; and wherein the second waveform combiner has as input four phases of the digital local oscillator signal, each having a phase shift of 45° with respect to two other phases.

3. The circuit according to claim 1, wherein the multiple phases of the digital local oscillator signal are generated from a digital local oscillator signal by two stages of two respective cascaded divide-by-2 circuits.

4. The circuit according to claim 1, wherein the multiple phases of the digital local oscillator signal are generated by a divide-by-4 circuit from a predetermined source digital local oscillator signal having 4 times a frequency of the digital local oscillator signal.

5. The circuit according to claim 4, wherein the divide-by-4 circuit is comprised of four latches connected in a ring configuration with an inverted polarity at an input of a first of the four latches, wherein the first latch and a third latch of the ring configuration are triggered by a rising edge of the digital local oscillator signal, and a second latch and a fourth latch of the ring configuration are triggered by a falling edge of the digital local oscillator signal.

6. The circuit according to claim 1, wherein the multiple phases of the digital local oscillator signal comprises eight respectively phase shifted phases of the digital local oscillator, which are generated from a input clock operated at 4 times a frequency of the digital local oscillator signal;
   wherein the first waveform combiner is arranged to generate, from four of the multiple phases of the digital local oscillator signal, four first switching control signals having a 25% duty-cycle, the first waveform combiner including outputs to output the four first switching control signals to the harmonic rejection mixer; and
   wherein the second waveform combiner is arranged to generate, from four of the multiple phases of the digital local oscillator signal, four second switching control signals having a 50% duty-cycle, the second waveform combiner including outputs to output the four second switching control signals to the harmonic rejection mixer.

7. A harmonic rejection mixer for mixing an input signal comprised of an in-phase and a quadrature input signal with a digital local oscillator signal,
   wherein the harmonic rejection mixer comprises two switching cores,
   wherein a first said switching core is switched by first switching control signals and a second switching core is switched by second switching control signals,
   wherein pulse centers of the second switching control signals coincide with pulse centers of the first switching control signals; and
   wherein the first and second switching control signals are generated by a circuit for producing multiple switching control signals from multiple phases of a digital local oscillator signal according to claim 1.

8. A method for producing multiple switching control signals for a harmonic rejection mixer from multiple phases of a digital local oscillator signal, the method comprising:
   a first generating step for generating from a first group of the multiple phases of the digital local oscillator signal at least one first switching control signal by logical combining two from the multiple phases of a digital local oscillator signal; and
   a second generating step for generating from a second group of the multiple phases of the digital local oscillator signal at least one second switching control signal by logical combining one from the multiple phases of a digital local oscillator signal with a predetermined signal having a static logical value; and
   in the first generating step, as a dummy load also generating from the first group of the multiple phases of the digital local oscillator signal at least one dummy switching control signal by logical combining one from the multiple phases of a digital local oscillator signal with a predetermined signal having a static logical value; and in the second generating step, as a dummy load also generating from the second group of the multiple phases of the digital local oscillator signal at least one dummy switching control signal by logical combining two from the multiple phases of a digital local oscillator signal.

9. The method according to claim 8,
wherein the first switching control signal and the second switching control signal are used to control the harmonic rejection mixer, and
wherein the at least one dummy switching control signal from the first generating step and the at least one dummy switching control signal from the second generating step are not used to control the harmonic rejection mixer.

10. The method according to claim 8, wherein the first generating step has as input four phases of the digital local oscillator signal, each having a phase shift of 90° with respect to two other phases; and wherein the second generating step has as input four phases of the digital local oscillator signal, each having a phase shift of 45° with respect to two other phases.

11. The method according to claim 8, wherein the multiple phases of the digital local oscillator signal are generated from a digital local oscillator signal by two stages of two respective cascaded divide-by-2 circuits.

12. The method according to claim 8, wherein the multiple phases of the digital local oscillator signal are generated by a divide-by-4 circuit from a predetermined source digital local oscillator signal having 4 times a frequency of the digital local oscillator signal.

13. The method according to claim 12, wherein the divide-by-4 circuit is comprised of four latches connected in a ring configuration with an inverted polarity at an input of a first of the four latches, wherein the first latch and a third latch of the ring configuration are triggered by a rising edge of the digital local oscillator signal, and a second latch and a fourth latch of the ring configuration are triggered by a falling edge of the digital local oscillator signal.

14. The method according to claim 8, wherein the multiple phases of the digital local oscillator signal comprises eight respectively phase shifted phases of the digital local oscillator, which are generated from a input clock operated at 4 times a frequency of the digital local oscillator signal;
wherein the first generating step comprises generating, from four of the multiple phases of the digital local oscillator signal, four first switching control signals having a 25% duty-cycle, and outputting the four first switching control signals to the harmonic rejection mixer; and
wherein the second generating step comprises generating, from four of the multiple phases of the digital local oscillator signal, four second switching control signals having a 50% duty-cycle, and outputting the four second switching control signals to the harmonic rejection mixer.

* * * * *